United States Patent
Zurek et al.

(10) Patent No.: US 9,628,910 B2
(45) Date of Patent: Apr. 18, 2017

(54) METHOD AND APPARATUS FOR REDUCING ACOUSTIC FEEDBACK FROM A SPEAKER TO A MICROPHONE IN A COMMUNICATION DEVICE

(71) Applicant: Motorola Mobility LLC, Chicago, IL (US)

(72) Inventors: Robert Zurek, Antioch, IL (US); Giles T Davis, Mundelein, IL (US); Plamen A Ivanov, Schaumburg, IL (US)

(73) Assignee: Motorola Mobility LLC, Chicago, IL (US)

( * ) Notice: Subject to any disclaimer, the term of this patent is extended or adjusted under 35 U.S.C. 154(b) by 6 days.

(21) Appl. No.: 14/800,281

(22) Filed: Jul. 15, 2015

(65) Prior Publication Data

US 2017/0019734 A1    Jan. 19, 2017

(51) Int. Cl.
  *H04R 3/00* (2006.01)
  *H04R 3/02* (2006.01)
  *H04S 7/00* (2006.01)
  *G10L 25/78* (2013.01)

(52) U.S. Cl.
  CPC ............... *H04R 3/02* (2013.01); *G10L 25/78* (2013.01); *H04S 7/30* (2013.01)

(58) Field of Classification Search
  CPC .............. H04R 3/02; H04S 7/30; G10L 25/78
  See application file for complete search history.

(56) References Cited

U.S. PATENT DOCUMENTS

| 6,665,645 B1* | 12/2003 | Ibaraki ................... G10L 15/20 704/226 |
| 2009/0010453 A1 | 1/2009 | Zurek |
| 2009/0041263 A1* | 2/2009 | Hoshuyama ............. H04B 3/32 381/94.1 |
| 2012/0245933 A1* | 9/2012 | Flaks .................. G10L 21/0208 704/233 |

* cited by examiner

*Primary Examiner* — Muhammad N Edun
(74) *Attorney, Agent, or Firm* — Matthew C. Loppnow; Watson Intellectual Property Group

(57) ABSTRACT

A method and apparatus to reduce acoustic feedback from a speaker to a microphone in a communication device. An audio signal can be reproduced by an apparatus. An audible signal of at least one near-end user can be voice activity detected at the apparatus. At least one audio output channel of multiple audio output channels can be operated on to attenuate acoustic pressure representative of the audio signal near at least one microphone aperture location when the audible signal of the at least one near-end user is detected at the apparatus.

23 Claims, 3 Drawing Sheets

METHOD AND APPARATUS FOR REDUCING ACOUSTIC FEEDBACK FROM A SPEAKER TO A MICROPHONE IN A COMMUNICATION DEVICE

BACKGROUND

1. Field

The present disclosure is directed to a method and apparatus for reducing acoustic feedback from a speaker to a microphone in a communication device.

2. Introduction

Presently, traditional speakerphones have one speaker and one microphone located a distance from the speaker. Portable communication devices, such as cellular phones, smartphones, tablet computers, and other communication devices also have speakerphone functionality. When a speakerphone mode is operational, the microphone on the device picks up a local user's voice for transmission to a remote user. Unfortunately, the microphone also picks up a remote user's voice coming through the speaker and sends it back to the remote user, which results in the remote user hearing an undesirable echo to what they are saying. To avoid the echo, speakerphones employ echo cancellation that processes the signal after it is received at the microphone to remove the echo. However, the echo cancellation is not optimal, especially when there is more than one operational speaker on the speakerphone.

Thus, there is a need for a method and apparatus for reducing acoustic feedback from a speaker to a microphone in a communication device.

BRIEF DESCRIPTION OF THE DRAWINGS

In order to describe the manner in which advantages and features of the disclosure can be obtained, a description of the disclosure is rendered by reference to specific embodiments thereof which are illustrated in the appended drawings. These drawings depict only example embodiments of the disclosure and are not therefore to be considered to be limiting of its scope.

DETAILED DESCRIPTION

Embodiments provide a method and apparatus for reducing acoustic feedback from a speaker to a microphone in a communication device. According to a possible embodiment, an audio signal can be reproduced by an apparatus. An audible signal of at least one near-end user can be voice activity detected at the apparatus. At least one audio output channel of multiple audio output channels can be operated on to attenuate acoustic pressure representative of the audio signal near at least one microphone aperture location when the audible signal of the at least one near-end user is detected at the apparatus.

For example, when a near-end user is speaking while audio is playing through a speaker of a device, they are paying less attention to the audio being reproduced than to what they are saying. Thus, when the user is talking, the quality of the audio playback can be compromised with little effect on the audio quality perceived by the user. While some communication devices have one speaker, others have stereo or even more speakers. Using stereo or multiple speakers when reproducing audio on these devices provides more output. However, because the stereo speakers are located a distance from each other on the device, one of the stereo speakers may be closer to the microphone than the other speaker. Otherwise, the microphone can be placed further away from a single speaker. This causes a problem because it increases the audio signals picked up at the microphone from the closer speaker and causes increased echo. This is also a problem when other sources of audio are playing through the speakers, which can be picked up by the microphone that is closer to the closest speaker. Embodiments can improve microphone reception of an audio signal of a user while reducing microphone reception of audio signals playing through speakers of an apparatus.

Figure 1:
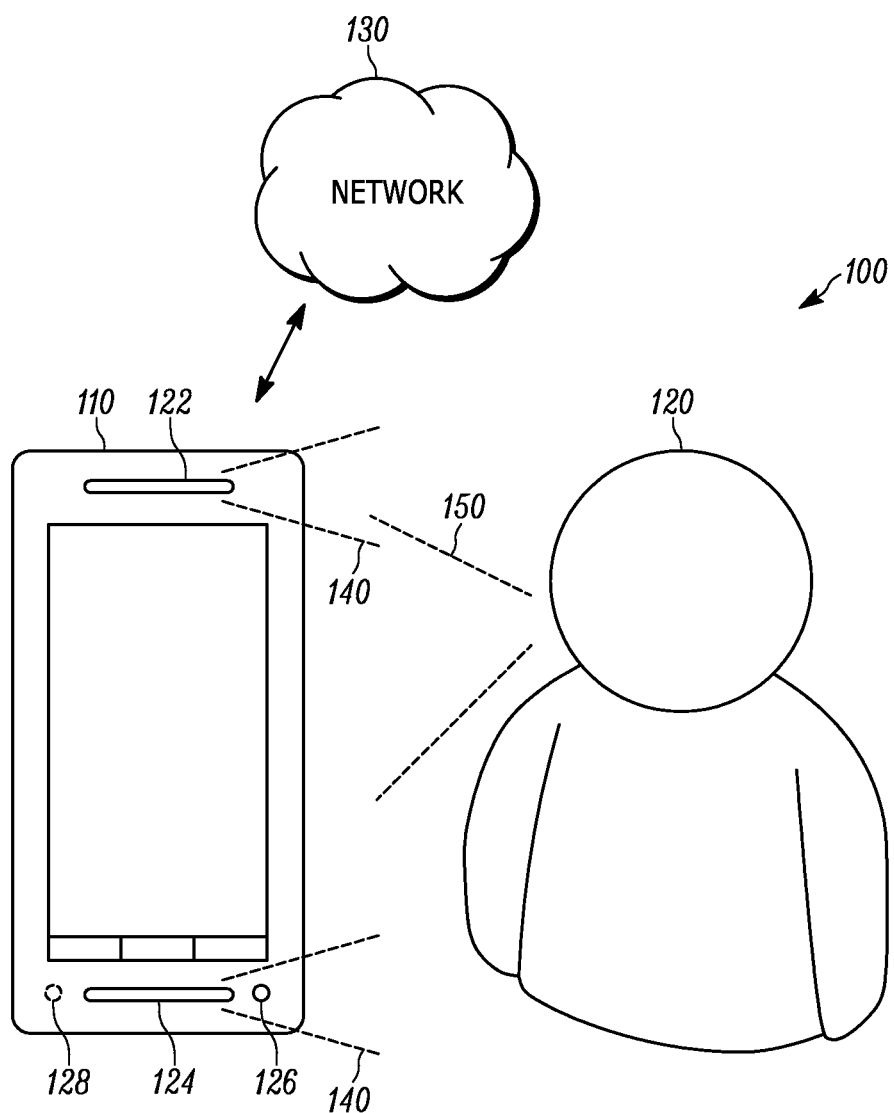
FIG. 1 is an example schematic diagram of a system according to a possible embodiment.

FIG. 1 is an example schematic diagram of a system 100 according to a possible embodiment. The system 100 can include a communication device 110, a user 120, and a network 130. The communication device 110 can include multiple audio channels that are represented in the system 100 as speakers with apertures 122 and 124. The communication device 110 can also include at least one microphone with an aperture 126, and can optionally include at least one other microphone with an aperture 128. The communication device 110 can be any device that can receive audible signals 150 from the user 120 and reproduce audio signals 140 received remote from the communication device 110 and/or stored locally on the communication device 110. The communication device 110 can be a wireless terminal, a portable wireless communication device, a smartphone, a cellular telephone, a flip phone, a personal digital assistant, a laptop computer, a personal computer, a selective call receiver, a tablet computer, a speakerphone, or any other device that is capable of receiving audible signals 150 from the user 120 and reproducing audio signals 140. The communication device 110 can send and receive the audio signals over the network 130 and can also reproduce the audio signal 140 from data stored on the device. Furthermore, the communication device 110 can voice activity detect an audible signal 150 of at least one near-end user 120.

The network 130 can include any type of network that is capable of sending and receiving network communication signals. For example, the network 130 can include a wired communication network, a wireless communication network, a cellular telephone network, a Time Division Multiple Access (TDMA)-based network, a Code Division Multiple Access (CDMA)-based network, an Orthogonal Frequency Division Multiple Access (OFDMA)-based network, a Long Term Evolution (LTE) network, a 3rd Generation Partnership Project (3GPP)-based network, a satellite communications network, a high altitude platform network, and/or other communication networks.

Figure 2:
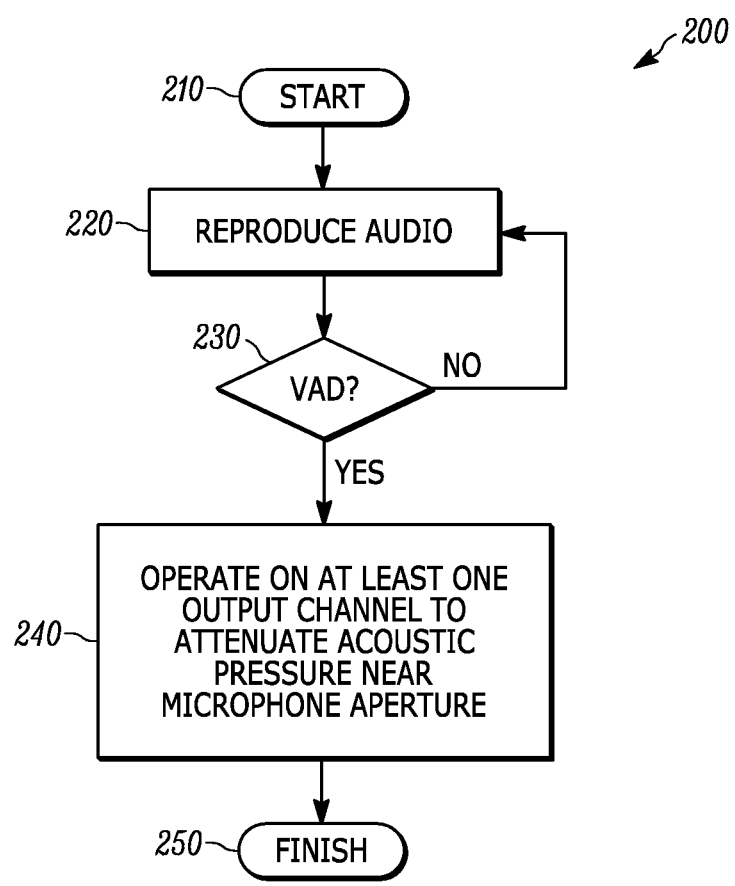
FIG. 2 is an example flowchart illustrating the operation of an apparatus according to a possible embodiment.

FIG. 2 is an example flowchart 200 illustrating the operation of an apparatus, such as the communication device 110, according to a possible embodiment. At 210, the flowchart 200 can begin.

At 220, an audio signal can be reproduced. Audio sources of the reproduced audio signal can include locally memory stored audio, streamed audio, synthesized audio, voice call audio, such as from a far-end user, multimedia audio, music, audio alerts, ring-tones, and other sources of audio. According to a possible embodiment, the audio signal can be received in a downlink signal from a far-end user over a wireless or wired network.

At 230, a determination can be made as to whether an audible signal of at least one near-end user has been voice activity detected at the apparatus. While voice activity detection is used to detect the audible signal, the audible signal may or may not be a voice signal. In particular, the audible signal can be an audible signal intentionally generated by a user, such as a voice signal, or can be another intentional audible signal generated by the near-end user and the intentional audible signal can be voice activity detected even if it is not a voice signal. For example, the intentional audible signal can be speech of the near-end user during a voice call, can be a command from the near-end user to activate a voice assistant on an electronic device, and/or can be a sound intentionally generated by a user. Further examples of the intentional audible signal can include sounds from a user's mouth, such as clucking or clicking, sounds from a user's hands, such as tapping, snapping, and clapping, sounds from other sources, such as an alarm, a buzzer, or music, and/or any other sound a user can generate. The apparatus can determine the audible signal is intentional by comparing the captured sound to known sounds in its memory, by performing speaker identification and recognizing the voice of the owner of the device or one of a number of registered users, by processing the sound with a voice activity detection algorithm, or by any other process of determining a type of sound. The user can generate or set up the intentional audible signal to trigger an activity or process on the apparatus. According to a possible embodiment, the audio signal can be a downlink signal containing speech audio from the far-end user and the audible signal of at least one near-end user can be an audible speech signal of the at least one near-end user.

The voice activity detection can include any known and future voice activity detection including, a single microphone/channel voice activity detector, a multi-microphone/multi-channel voice activity detector, an optical voice activity detector, a laser based voice activity detector, a vibration based voice activity detector, a radio frequency voice activity detector, and any other device or process that detects an audible signal. If the audible signal has not been determined to be voice activity resulting in a negative voice activity detection, then the audio signal can continue to be reproduced at 220.

At 240, when the audible signal of the at least one near-end user is detected at the apparatus at 230, at least one audio output channel of multiple audio output channels can be operated on to attenuate acoustic pressure representative of the audio signal near at least one microphone aperture location. A microphone aperture can be an opening in a housing that feeds acoustic pressure to the microphone. An audio output channel can include a chain of one or more of a processor, a mixer, a Digital to Analog (D/A) converter, an audio amplifier, and/or an output transducer and its associated aperture, and/or any other process, device, or circuit that can reproduce an audio signal. An output transducer can be a speaker, a linear vibrator, a piezoelectric transducer, and/or any other transducer that can generate sound.

According to a possible embodiment, the multiple audio output channels can include at least one speaker each to provide a plurality of speakers. The one audio output channel of multiple audio output channels can be operated on by attenuating the audio output channel containing a speaker that is the loudest at the microphone aperture location. The loudest speaker can be the closest speaker to the microphone aperture location or can be another speaker that is the loudest at the microphone aperture location. Attenuating can be performed by ramping attenuation from a full playback level to a desired attenuation level, thereby gradually reducing the perceived volume from the loudest speaker. The desired level of attenuation can even mean completely muting the loudest speaker.

According to another possible embodiment, the microphone can include at least one microphone, or two or more microphones, with corresponding apertures, each microphone and aperture at a different location in the housing. The one audio output channel of multiple audio output channels can be operated on by filtering a signal to at least one speaker to create destructive interference of the reproduced audio signal at the microphone aperture location of the at least one microphone. The one audio output channel of multiple audio output channels can also be operated on by phasing a signal to at least one speaker to create destructive interference of the reproduced audio signal at each microphone aperture location of the at least one microphone. For example, a reduction of signal at one or more microphone location can be achieved by appropriately phasing the signal to one or both of the speakers, such that there is destructive interference at each microphone location. The phasing can be frequency dependent to allow for maximal cancellation at each frequency for each specified location. In this embodiment the signal prior to the phase filter can be monophonic. If the downlink signal is stereo, when the voice activity detection is true, the stereo signal can be summed to monophonic, and then the appropriate filter or filters can be applied. A cancellation filter can be applied to one channel while no filter is applied to the other, or a phase delay can be split between complimentary filters on each channel. The complementary filters may or may not be symmetric depending on the position and number of microphones that require cancellation.

According to another possible embodiment, the audio signal can be a stereo signal. The one audio output channel of multiple audio output channels can then be operated on by applying a cross-talk canceller with a minimum at a microphone aperture location of the at least one microphone to reduce the level of the reproduced audio signal at the microphone location. For example, when the downlink signal is stereo, the reduction of the signal at the microphone location can be achieved by implementing a stereo cross-talk canceller with a minimum at the microphone location. The cross-talk canceller can be applied when the voice activity detection is true, and removed when the voice activity detection is false. The gain of the cross-talk cancellation may be ramped from no attenuation to full attenuation over a period of time after the voice activity detection is detected true. The canceller gain can then be ramped back to no attenuation after a false voice activity is detected.

In another embodiment, when there is more than one microphone and the physical signal produced by one or combination of multiple speakers at a first microphone aperture is attenuated, minimized, and/or cancelled, such as through the application of cross-talk canceller, or filtering, or phasing, or attenuation, or by other method, the other microphone(s) can be reduced, such as muted or otherwise attenuated, and/or have their signals replaced by a signal produced by the microphone that is coupled to the first microphone aperture. For example, the apparatus can include a first microphone acoustically coupled to the at least one microphone aperture location and a second microphone, and the output of the second microphone can be reduced when the audible signal of the at least one near-end user is detected at the apparatus.

According to another possible embodiment, the at least one audio output channel can include a plurality of audio output channels and the audio signal can be a multiple channel signal. For example, a multiple channel signal can be a stereo signal, a quadraphonic signal, a surround sound signal, or any other multiple channel signal. The one audio output channel of multiple audio output channels can then be operated on by converting the multiple channel signal to a monaural signal and feeding the monaural signal to at least two of the plurality audio output channels. The monaural signal can also be fed to more or all of the plurality audio output channels. In this embodiment, when the audio signal is stereo or more channels, the stereo or more channel signal can be converted to a monaural signal when the voice activity detection is true. In this case, the conversion to monaural can be done without phase cancellation, but optionally with attenuation of the speakers. This can allow the use of a monaural echo-canceller instead of requiring a stereo echo canceller. The stereo signal can also be converted to a monaural signal to aid in echo cancellation of the microphone signal(s) that feed the voice activity detection.

For example, embodiments can use an uplink Voice Activity Detector (VAD) decision to attenuate the speaker of the at least one audio output channel when the local user is talking. The speaker being attenuated can be the one loudest at the microphone. The attenuation can be any level from a full mute up to a level that is able to be cancelled by the echo canceller in the device. For improved user experience, the gain on the speaker nearest the microphone can be ramped at a given rate from the full level playback to the desired attenuation level, such as using a reduction of level of 6 dB/second, or any other reduction rate. The gain can ramp back up to full volume after a false VAD is detected. At 250, the flowchart 200 can end.

It should be understood that, notwithstanding the particular steps as shown in the figures, a variety of additional or different steps can be performed depending upon the embodiment, and one or more of the particular steps and embodiments can be rearranged, combined, repeated and/or eliminated entirely depending upon the embodiment. Also, some of the steps performed can be repeated on an ongoing or continuous basis simultaneously while other steps are performed. Furthermore, different steps can be performed by different elements or in a single element of the disclosed embodiments.

Figure 3:
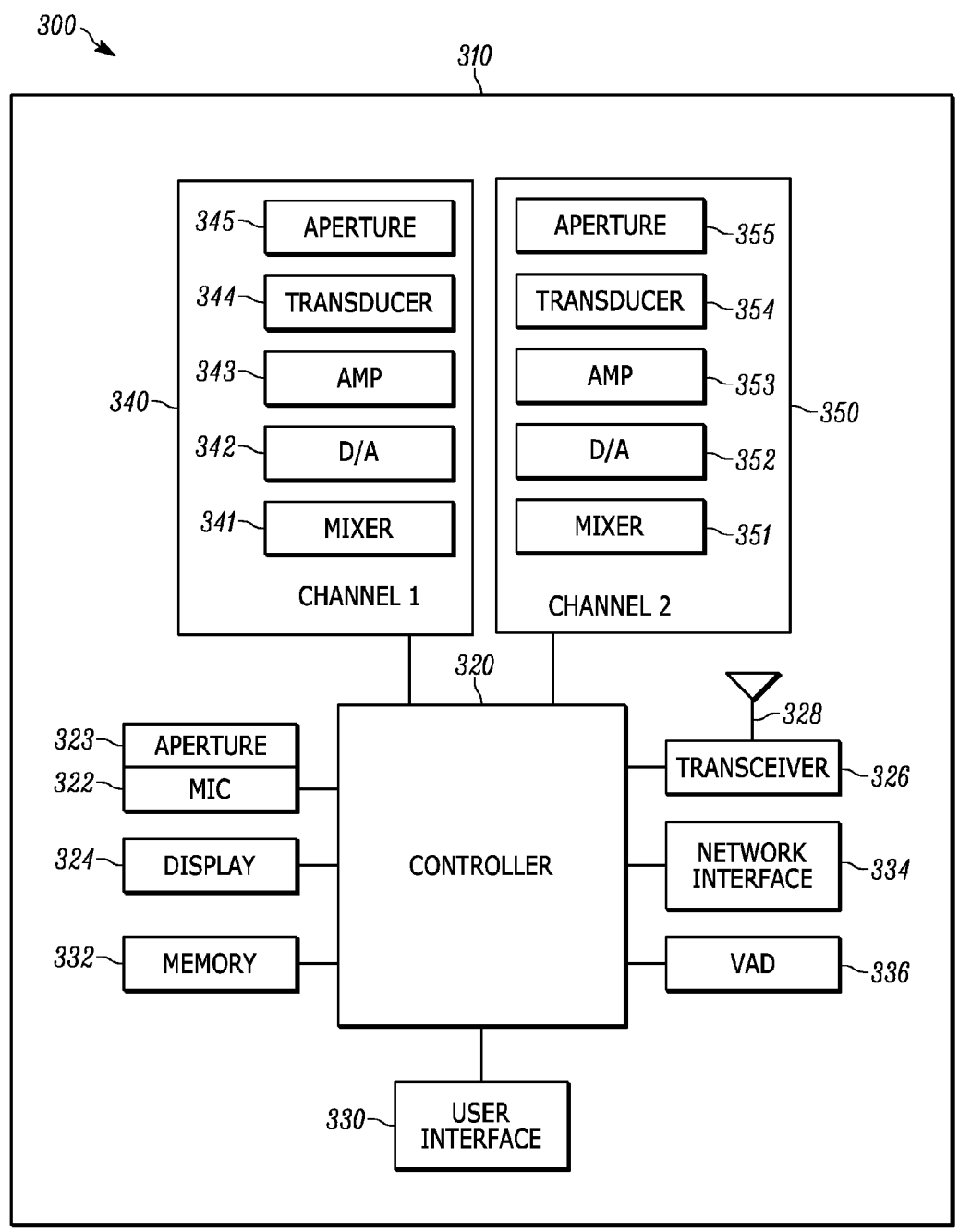
FIG. 3 is an example block diagram of an apparatus according to a possible embodiment.

FIG. 3 is an example block diagram of an apparatus 300, such as the communication device 110, according to a possible embodiment. The apparatus 300 can include a housing 310, a controller 320 within the housing 310, at least one microphone 322 coupled to the controller 320 and corresponding aperture 323, a display 324 coupled to the controller 320, a transceiver 326 coupled to the controller 320, an antenna 328 coupled to the transceiver 326, a user interface 330 coupled to the controller 320, a memory 332 coupled to the controller 320, a network interface 334 coupled to the controller 320, and a voice activity detection module 336. The apparatus 300 can also include at least two audio output channels 340 and 350. Each audio output channel can include a mixer 341 and 351, a Digital to Analog (D/A) converter 342 and 352, an amplifier 343 and 353, a transducer 344 and 354, an aperture 345 and 355, and/or any other useful device or circuit for reproducing an audio signal. The apparatus 300 can perform the methods described in all the embodiments.

The display 324 can be a viewfinder, a liquid crystal display (LCD), a light emitting diode (LED) display, a plasma display, a projection display, a touch screen, or any other device that displays information. The transceiver 326 can include a transmitter and/or a receiver. The microphone 322 can include a microphone, a speaker, a transducer, or any other audio input circuitry. The microphone 322 can be acoustically coupled to the microphone aperture 323 to receive acoustic signals. The user interface 330 can include a keypad, a keyboard, buttons, a touch pad, a joystick, a touch screen display, another additional display, or any other device useful for providing an interface between a user and an electronic device. The network interface 334 can be a universal serial bus port, an Ethernet port, an infrared transmitter/receiver, a USB port, an IEEE 1393 port, a WLAN transceiver, or any other interface that can connect an apparatus to a network or computer and that can transmit and receive data communication signals. The memory 332 can include a random access memory, a read only memory, an optical memory, a flash memory, a removable memory, a hard drive, a cache, or any other memory that can be coupled to a wireless communication device.

The apparatus 300 and/or the controller 320 may implement any operating system, such as Microsoft Windows®, UNIX®, or LINUX®, Android™, or any other operating system. Apparatus operation software may be written in any programming language, such as C, C++, Java or Visual Basic, for example. Apparatus software may also run on an application framework, such as, for example, a Java® framework, a .NET® framework, or any other application framework. The software and/or the operating system may be stored in the memory 332 or elsewhere on the apparatus 300. The apparatus 300 and/or the controller 320 may also use hardware to implement disclosed operations. For example, the controller 320 may be any programmable processor. Disclosed embodiments may also be implemented on a general-purpose or a special purpose computer, a programmed microprocessor or microprocessor, peripheral integrated circuit elements, an application-specific integrated circuit or other integrated circuits, hardware/electronic logic circuits, such as a discrete element circuit, a programmable logic device, such as a programmable logic array, field programmable gate-array, or the like. In general, the controller 320 may be any controller or processor device or devices capable of operating an electronic device and implementing the disclosed embodiments. The voice activity detection module 336 can be a hardware module, can be a software module, can be part of the controller 320, can be separate from the controller 320, can be stored in the memory 332, can be implemented by the controller 320 or by some other processor, can reside within apparatus 300, can exist in a cloud based processor, and/or can be any other hardware or software module that can detect an audible signal of at least one near-end user at the apparatus 300.

In operation, the audio output channels 340 and 350 can reproduce an audio signal. The voice activity detecting module 336 can detect an audible signal of at least one near-end user at the apparatus 300.

The controller 320 can operate on at least one audio output channel 340 of the plurality of audio output channels 340 and 350 to attenuate acoustic pressure representative of the audio signal near the at least one microphone aperture 323 location when the audible signal of the at least one near-end user is detected at the apparatus 300. According to a possible embodiment, the controller 320 can operate on the at least one audio output channel 340 by attenuating the audio output channel 340 containing a loudest speaker, such as the transducer 344, at the microphone aperture 323. Attenuating can include ramping attenuation from a full playback level to a desired attenuation level, thereby gradually reducing the perceived volume from the loudest speaker.

According to a possible embodiment, the controller 320 can operate on the at least one audio output channel 340 by filtering a signal to at least one speaker to create destructive interference of the reproduced audio signal at the microphone aperture 323. The controller 320 can also operate on the at least one audio output channel 340 by phasing a signal to at least one speaker to create destructive interference of the reproduced audio signal at the microphone aperture 323. The controller 320 can additionally create destructive interference at more than one microphone aperture. The controller 320 can further reduce an output of at least one second microphone of the at least one microphone 322 when the audible signal of the at least one near-end user is detected at the apparatus 300.

According to a possible embodiment, the audio signal can be a stereo signal. The controller 320 can operate on the at least one audio output channel 340 by applying a cross-talk canceller with a minimum at the microphone aperture location 323 of the at least one microphone 322 to reduce the level of the reproduced audio signal at the microphone aperture 323 location. According to a related implementation, the audio signal can be a multiple channel signal and the controller 320 can convert the multiple channel signal to a monaural signal and feed the monaural signal to at least two of the plurality audio output channels 340 and 350.

The method of this disclosure can be implemented on a programmed processor. However, the controllers, flowcharts, and modules may also be implemented on a general purpose or special purpose computer, a programmed microprocessor or microcontroller and peripheral integrated circuit elements, an integrated circuit, a hardware electronic or logic circuit such as a discrete element circuit, a programmable logic device, or the like. In general, any device on which resides a finite state machine capable of implementing the flowcharts shown in the figures may be used to implement the processor functions of this disclosure.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of" followed by a list is defined to mean one, some, or all, but not necessarily all of, the elements in the list. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is written as the inventor's own understanding of the context of some embodiments at the time of filing and includes the inventor's own recognition of any problems with existing technologies and/or problems experienced in the inventor's own work.

We claim:

1. A method comprising:
    reproducing an audio signal by an apparatus;
    voice activity detecting an audible signal of at least one user at the apparatus; and
    operating on at least one audio output channel of multiple audio output channels to attenuate acoustic pressure representative of the audio signal near at least one microphone aperture location when the audible signal of the at least one user is detected at the apparatus.

2. The method according to claim 1,
    wherein the multiple audio output channels comprise a plurality of speakers, and
    wherein operating comprises attenuating the audio output channel containing a speaker that is loudest at the microphone aperture location.

3. The method according to claim 2, wherein attenuating includes ramping attenuation from a full playback level to a desired attenuation level, thereby gradually reducing the perceived volume from the loudest speaker.

4. The method according to claim 1,
    wherein operating comprises filtering a signal to at least one speaker to create destructive interference of the reproduced audio signal at the at least one microphone aperture location.

5. The method according to claim 1,
    wherein operating comprises phasing a signal to at least one speaker to create destructive interference of the reproduced audio signal at the at least one microphone aperture location.

6. The method according to claim 1,
    wherein the audio signal comprises a stereo signal, and
    wherein operating comprises applying a cross-talk canceller with a minimum at a microphone aperture location of the at least one microphone to reduce the level of the reproduced audio signal at the microphone location.

7. The method according to claim 1,
    wherein the at least one audio output channel comprises a plurality of audio output channels,
    wherein the audio signal comprises a multiple channel signal, and
    wherein operating comprises converting the multiple channel signal to a monaural signal and feeding the monaural signal to at least two of the plurality audio output channels.

8. The method according to claim 1,
    wherein voice activity detecting comprises voice activity detecting an audible signal of at least one near-end user at the apparatus, where a near-end user is a user that provides an audible signal to the apparatus;
    wherein the audio signal comprises a downlink signal containing speech audio from the far-end user, where a far-end user is a user that provides the downlink signal containing speech audio, and
    wherein the audible signal of at least one near-end user comprise an audible speech signal of the at least one near-end user.

9. The method according to claim 1, wherein the apparatus comprises a cellular phone.

10. The method according to claim 1,
wherein the apparatus includes a first microphone acoustically coupled to the at least one microphone aperture location and the apparatus includes a second microphone,
wherein the method further comprises reducing an output of the second microphone when the audible signal of the at least one user is detected at the apparatus.

11. The method according to claim 1,
wherein the apparatus includes a first microphone acoustically coupled to the at least one microphone aperture location and the apparatus includes a second microphone,
wherein the method further comprises substituting a signal from the second microphone with a signal from the first microphone when the audible signal of the at least one user is detected at the apparatus.

12. An apparatus comprising:
a housing;
at least one microphone aperture at a location in the housing;
at least one microphone acoustically coupled to the at least one microphone aperture;
a plurality of audio output channels configured to reproduce an audio signal;
a voice activity detecting module configured to detect an audible signal of at least one user at the apparatus; and
a controller coupled to the microphone, the plurality of audio output channels, and the voice activity detecting module, the controller configured to operate on at least one audio output channel of the plurality of audio output channels to attenuate acoustic pressure representative of the audio signal near the at least one microphone aperture location when the audible signal of the at least one user is detected at the apparatus.

13. The apparatus according to claim 12,
wherein the plurality of audio output channels each comprise at least one speaker, and
wherein the controller is configured to operate on the at least one audio output channel by attenuating the audio output channel containing a speaker that is loudest at the microphone aperture location.

14. The apparatus according to claim 13, wherein attenuating includes ramping attenuation from a full playback level to a desired attenuation level, thereby gradually reducing the perceived volume from the loudest speaker.

15. The apparatus according to claim 12,
wherein the controller is configured to operate on the at least one audio output channel by filtering a signal to at least one speaker to create destructive interference of the reproduced audio signal at the at least one microphone aperture location.

16. The apparatus according to claim 12,
wherein the controller is configured to operate on the at least one audio output channel by phasing a signal to at least one speaker to create destructive interference of the reproduced audio signal at the at least one microphone aperture location.

17. The apparatus according to claim 12,
wherein the audio signal comprises a stereo signal, and
wherein the controller is configured to operate on the at least one audio output channel by applying a cross-talk canceller with a minimum at the microphone aperture location of the at least one microphone to reduce the level of the reproduced audio signal at the microphone aperture location.

18. The apparatus according to claim 12,
wherein the audio signal comprises a multiple channel signal, and
wherein the controller is configured to convert the multiple channel signal to a monaural signal and feed the monaural signal to at least two of the plurality audio output channels.

19. The apparatus according to claim 12,
wherein the voice activity detecting module detects an audible signal of at least one user at the apparatus, where a near-end user is a user that provides an audible signal to the apparatus,
wherein the audio signal comprises a downlink signal containing speech audio from the far-end user, where a far-end user is a user that provides the downlink signal containing speech audio, and
wherein audible signal of at least one near-end user comprise an audible speech signal of the at least one near-end user.

20. The apparatus according to claim 12, wherein the apparatus comprises a cellular phone.

21. The apparatus according to claim 12,
wherein the at least one microphone comprises a first microphone,
wherein the apparatus further comprises at least one second microphone,
wherein the controller is configured to reduce an output of the at least one second microphone when the audible signal of the at least one user is detected at the apparatus.

22. A method comprising:
receiving, at a cellular device, a downlink signal containing an audio signal from a far-end user, where a far-end user is a user that provides a downlink signal containing speech audio to the apparatus;
reproducing the audio signal by the cellular device;
voice activity detecting an audible speech signal of at least one near-end user at a microphone at the cellular device, where a near-end user is a user that provides an audible signal to the apparatus; and
operating on at least one audio output channel of multiple audio output channels to attenuate acoustic pressure representative of the audio signal near a microphone aperture location for the microphone when the audible speech signal of the at least one near-end user is detected at the cellular device.

23. The method according to claim 22,
wherein the cellular device comprises a plurality of speakers, and
wherein operating comprises attenuating the audio output channel containing a closest speaker of the plurality of speakers to the microphone aperture location.

* * * * *